(12) United States Patent
Mizuno et al.

(10) Patent No.: US 7,679,328 B2
(45) Date of Patent: Mar. 16, 2010

(54) APPARATUS FOR DETECTING CHARGED STATE OF SECONDARY BATTERY

(75) Inventors: Satoru Mizuno, Nishio (JP); Atsushi Hashikawa, Okazaki (JP); Shoji Sakai, Toyota (JP); Kenji Ueda, Nagoya (JP); Katsunori Tanaka, Ichinomiya (JP); Takeshi Sada, Toyota (JP); Akira Kato, Kani (JP); Masahiro Sou, Anjo (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 538 days.

(21) Appl. No.: 11/586,620

(22) Filed: Oct. 26, 2006

(65) Prior Publication Data
US 2007/0090805 A1  Apr. 26, 2007

(30) Foreign Application Priority Data
Oct. 26, 2005 (JP) ............................. 2005-311522

(51) Int. Cl.
*H02J 7/00* (2006.01)
(52) U.S. Cl. ...................................... 320/132; 324/427
(58) Field of Classification Search ................. 320/132; 324/427
See application file for complete search history.

(56) References Cited

U.S. PATENT DOCUMENTS

| | | | | |
|---|---|---|---|---|
| 4,484,130 A | * | 11/1984 | Lowndes et al. | ............ 320/116 |
| 4,947,123 A | * | 8/1990 | Minezawa | .................. 324/427 |
| 4,968,942 A | * | 11/1990 | Palanisamy | ................. 324/430 |
| 5,214,385 A | * | 5/1993 | Gabriel et al. | ............... 324/434 |
| 5,694,023 A | * | 12/1997 | Podrazhansky et al. | ..... 320/129 |
| 5,708,347 A | * | 1/1998 | Palanisamy et al. | ......... 320/132 |
| 6,064,182 A | * | 5/2000 | Eguchi | ....................... 320/132 |
| 6,285,163 B1 | * | 9/2001 | Watanabe et al. | ........... 320/132 |
| 6,366,054 B1 | * | 4/2002 | Hoenig et al. | ............... 320/132 |
| 6,424,157 B1 | * | 7/2002 | Gollomp et al. | ............. 324/430 |
| 6,531,874 B2 | | 3/2003 | Mentgen et al. | |
| 6,608,482 B2 | * | 8/2003 | Sakai et al. | .................. 324/426 |
| 7,317,300 B2 | * | 1/2008 | Sada et al. | ................... 320/136 |
| 2004/0257045 A1 | | 12/2004 | Sada et al. | |
| 2005/0073315 A1 | * | 4/2005 | Murakami et al. | .......... 324/433 |
| 2006/0055373 A1 | * | 3/2006 | Bopp et al. | ................. 320/132 |

FOREIGN PATENT DOCUMENTS

| | | | |
|---|---|---|---|
| JP | 040121781 A | * | 8/1989 |
| JP | A 9-297163 | | 11/1997 |
| JP | A 2002-222668 | | 8/2002 |
| JP | A 2002-250757 | | 9/2002 |
| JP | A 2005-014637 | | 1/2005 |

\* cited by examiner

*Primary Examiner*—Edward Tso
*Assistant Examiner*—Samuel Berhanu
(74) *Attorney, Agent, or Firm*—Oliff & Berridge, PLC

(57) ABSTRACT

A charged state detecting apparatus for a secondary battery is provided, which can suppress deterioration in the accuracy of detecting a charged state, such as an SOC, the deterioration being caused by variation of a polarization state of a battery. The charged state detecting apparatus stabilizes an amount of polarization of the battery, stops power generation upon confirmation of the stabilization of the polarization amount, and sufficiently alters the current of the battery to sample a required number of data pairs of voltage and current of the battery. Using these data pairs, the charged state detecting apparatus detects a charged state, such as the SOC, of the battery.

7 Claims, 9 Drawing Sheets

| STATES | DEFINITIONS |
|---|---|
| RESIDUAL CAPACITY: SOH [Ah] | A PRESENT DISCHARGEABLE CAPACITY OF A BATTERY |
| CHARGED RATE: SOC [%] | THE RATE OF A RESIDUAL CAPACITY OF A BATTERY TO ITS FULL CAPACITY |
| FULL CHARGE CAPACITY: Q [Ah] | A PRESENT CHARGEABLE CAPACITY OF A BATTERY |

APPARATUS FOR DETECTING CHARGED STATE OF SECONDARY BATTERY

CROSS-REFERENCE TO RELATED APPLICATION

This application is based on and claims the benefit of priorities from earlier Japanese Patent Application No. 2005-311522 filed on Oct. 26, 2005 the description of which is incorporated herein by reference.

BACKGROUND OF THE INVENTION

1. Technical Field of the Invention

The present invention relates to an apparatus for detecting a charged state (i.e., "internal charged state" or simply, "internal state") of a secondary battery, which is able to reduce influences of battery polarization on estimation of a charged state of an electric storage device for vehicles.

2. Related Art

With the advance of larger capacity electric storage devices for vehicle and with the increasing growth in size of on-vehicle electric loading devices, accuracy has been demanded in measuring a charged state, such as an SOC (state of charge) indicative of a charged state of a battery or an SOH (state of health) Indicative of deterioration in the charged state of a battery, in an electric storage device for vehicles, so that overcharge or over-discharge can be prevented.

Known SOC detecting methods include a charge/discharge current integrating method, and a method for estimating the SOC based on battery characteristics (hereinafter also referred to as a "battery characteristics computing method"). The "battery characteristics computing method" herein refers to a method for estimating the SOC based on a relation of a voltage V and a current In of a battery with respect to the SOC. In particular, a pseudo open-circuit voltage Vo of a battery is known to have a strong correlation with the SOC, and hence a method is known in which the SOC is calculated based on the pseudo open-current voltage Vo which is calculated based on a number of measured voltages V and currents I.

Japanese Patent Application Laid-Open No. 9-297163 indicates one example of such a battery characteristics computing method and suggests an SOC calculating method in which a characteristics line indicative of voltage/current characteristics is determined using a least-squares method based on a number of paired data of current and voltage (also referred to as "data pair" or "voltage/current pair") detected from a battery, a maximum dischargeable power is calculated based on the characteristics line, and an SOC is determined based on the maximum dischargeable power.

However, in various types of conventional SOC computing methods, a problem has been raised that large errors are caused by battery polarization. For example, in case where charge/discharge polarization effect is so large as to have the relation between the battery voltage and the SOC largely changed depending on the charge/discharge history, such as a case of a lead-acid battery, an SOC estimation accuracy is significantly deteriorated. Therefore, in the charge/discharge current integrating method, auxiliary charge periods are required for periodically determining a specific SOC. This, however, has raised another problem that the fuel consumption is deteriorated. It has been a practice, therefore, to reduce a normally used SOC region of a battery in consideration of the variation in an amount of polarization to prevent overcharge or over-discharge. This, however, has raised a further problem that the weight and volume of the battery for realizing a required amount of charge/discharge is unavoidably increased.

SUMMARY OF THE INVENTION

The present invention has been made in light of the problems set forth above, and has an object of providing an apparatus for detecting charged state of a secondary battery, which is able to reduce deterioration in the accuracy of detection caused by the variation in the polarization state.

In order to resolve the problems set forth above, the present invention provides, as a basic structure, an apparatus for detecting a charged state of a battery being mounted on a vehicle, the apparatus comprising: a data acquiring device configured to acquire a plurality of pairs of data consisting of current and voltage of the battery; and a charged-state detecting device configured to detect the charged state of the battery based on the plurality of pairs of data acquired by the data acquisition device after recognizing stabilization of a polarized state of the battery.

The charged state of a secondary battery may preferably measured by an SOC (charged rate) indicative of a charged state and an SOH (residual capacity) Indicative of a deteriorated state (i.e., used state). The battery characteristics computing method mentioned above may be preferable as charged state detecting means, but the charge/discharge current integrating method may also be used. For example, when an amount of polarization is stabilized in estimating a pseudo open-circuit voltage of a battery in a periodical manner or under predetermined conditions in the charge/discharge current computing method, the accuracy in estimating a charged state can be improved, leading to reduction of the number of times of auxiliary charge operations which are periodically performed for a specific state of the SOC.

It is preferred that the charged-state detecting device comprises a stabilizing device configured to stabilize an amount of polarization of the battery at a predetermined level; and a calculating device configured to calculate the charged state of the battery by using the pairs of data acquired by the data acquiring device immediately after it is confirmed that the polarized state of the battery is stabilized by the stabilizing device.

Specifically, in the present invention, in order to perform a calculation of a charged state, the polarization state of a secondary battery is stabilized at a predetermined level in advance of sampling a voltage-current pair (data pair) of the secondary battery. Accordingly, values of the charged state (e.g., SOC) calculated on the basis of the sampled voltage-current pairs result in values under a predetermined polarization state, which are equal to each other. Thus, in observing the variations of SOCs of the battery, variations of polarization states can be cancelled so as to significantly enhance the accuracy in the estimation of a charged state.

It is still preferred that the stabilizing device is configured to charge and discharge the battery over a specified period of time. Thus, an amount of polarization can be well converged at a predetermined level.

It is still preferred that the stabilizing device is configured to make the amount of polarization of the battery converge at a predetermined amount, the amount of polarization of the battery being calculated based on charge and discharge currents acquired when the battery is subjected to charge and discharge at a fixed voltage. Thus, if the variation of the polarization amount is small with respect to a reference value of a polarization amount to be converged at, stabilization in the polarization amount can be promptly terminated.

It is still preferred that the calculating device is configured to acquire the pairs of data, by a necessary number of pairs of data, from the data acquiring device by changing the current of the battery after the polarized state of the battery is stabilized by the stabilizing device and calculate the charged state of the battery based on the acquired necessary number of pairs of data. Thus, the charge polarization can be prevented from being accelerated after stabilization of the polarization amount, so that errors, which would have been caused by the acceleration of the charge polarization, can be reduced in estimating a charged state.

It is still preferred that the calculating device is configured to calculate a pseudo open-circuit voltage of the battery based on the pairs of data acquired in a state where the polarized state of the battery is stabilized and an internal resistance of the battery calculated at a latest sampling time and to calculate an SOC (state of charge) based on the pseudo open-circuit voltage. Thus, a pseudo open-circuit voltage under a fixed polarization state can be obtained based on the voltage-current pairs and the internal resistance under the polarization amount stabilization state, so that the variation, which would have been caused by the variation of the polarization state, can be reduced in the pseudo open-circuit voltage.

It is still preferred that the calculating device comprises a predetermined input/output table showing relationships between input parameters defining state amounts of a plurality of types of reference batteries and output parameters defining charged states of the reference batteries, means for acquiring a necessary number of pairs of data, as the pairs of data, of the battery by forcibly changing current of the battery after the polarized state of the battery is stabilized by the stabilizing device, and means for calculating the charged state of the battery by calculating a state amount of the battery based on the acquired necessary number of pairs of data and inputting the resultant state amount of the battery to the input/output table.

Specifically, in the present aspect, the battery state quantity calculated from the data pairs is assigned to an input/output table that has been prepared in advance to determine a charged state of the secondary battery. Thus, by using a neural network, for example, as the input/output table, a charged state can be detected with high accuracy, the neural network having a good correlation between a battery state quantity (e.g., a pseudo open-circuit voltage Vo or an internal resistance R) and a charged state (e.g., SOC or SOH).

In the above structures, preferably, the charged-state detecting device further comprises control means for controlling the stabilizing device and the calculating device such that the polarized state of the battery is stabilized immediately after start of an engine being mounted on the vehicle and, immediately after the stabilization of the polarized state, the charged state of the battery is detected. Thus, from immediately after starting an on-vehicle engine, a charged state can be detected with high accuracy.

In the above structures, preferably, the charged-state detecting device further comprises control means for controlling the stabilizing device and the calculating device such that the polarized state of the battery is stabilized at intervals during an operation of an engine being mounted on the vehicle and, immediately after the stabilization of the polarized state, the charged state of the battery is detected. Thus, errors in detecting a charged state, e.g., current integration error, during traveling of the instant vehicle can be reduced.

In the above structures, preferably, the battery is connected to a generator being mounted on a vehicle so as to receive power to be charged from the generator and the charged-state detecting device further comprises command means for commanding the generator to raise the power to be charged only when the charged state of the battery detected immediately after the stabilization of the polarized state of the battery is less than a minimum reference value. Thus, the number of times of so-called auxiliary charge can be reduced.

In the foregoing basic structure, the charged-state detecting device comprises a determining device configured to determine whether or not the polarization of the battery substantially disappears; an acquiring device configured to acquire a necessary number of pairs of data of the battery through the data acquiring device by changing a current state of the battery immediately after the determining device determines that the polarization of the battery substantially disappears; and a charged-state calculating device configured to calculate the charged state of the battery based on the necessary number of pairs of data acquired by the acquiring device. Thus, deterioration in the accuracy in calculating a charged state, which would have been caused by the variation in the polarization amount, can be prevented without imposing a burden on the battery.

In this structure, preferably, the determining device is configured to determine that the polarization of the batter has substantially disappeared, provided that a state wherein a voltage of the battery is substantially equal to a reference value and a charge/discharge current is equal to or less than a reference value lasts more than a predetermined period of time. Thus, a determination can be made on the disappearance of polarization with simplicity and accuracy.

Still preferably, the determining device is configured to determine that the polarization of the battery has substantially disappeared, provided that a predetermined period of time has elapsed since a last turn-off operation of ignition of the vehicle and the charged-state calculating device is configured to calculate the charged state of the battery based on pairs of data acquired when an engine being mounted on the vehicle is started. Thus, estimation on a charged state of a secondary battery can be made immediately after starting an on-vehicle engine. Further, the electric current conditions of the secondary battery are not required to be forcedly changed only for sampling the data pairs for estimating a charged state of the secondary battery, thereby reducing a burden on the battery.

DETAILED DESCRIPTION OF THE PREFERRED EMBODIMENTS

Hereinafter are described some preferred embodiments of a charged state detecting apparatus for a secondary battery according to the present invention. However, the present invention should not be limited to the embodiments described below. Needless to say, the present invention may be combined with other known art or art having functions equivalent to the known art to implement the technical concept of the present invention.

Prior to detailed description of the following embodiments explained in connection with FIGS. 1 to 11, the charged state of a battery (secondary battery, rechargeable battery) will be defined with reference to FIG. 12. As illustrated, an SOH (residual capacity) (Ah), means a present dischargeable capacity of a battery, an SOC (state of charge) (%), called "charged rate," means the rate of a residual capacity of a battery to a full charge capacity thereof, and a full charge capacity Q (Ah) means a present chargeable capacity in a battery. Hence, by way of example, suppose that a new battery which has not been used yet has an SOH of 64 Ah corresponding to an SOC of 100% (i.e., a full charge capacity of 64 Ah). In this battery, an SOH of 25.6 Ah corresponds to an SOC of 40%. And suppose that this new battery has been used and its charging ability is degraded considerably so that a full charge capacity is 40 Ah. However this capacity amount still corresponds to an SOC of 100% and, in this case, an SOC of 40% means an SOH of 16.0 Ah.

First Embodiment

Figure 1:
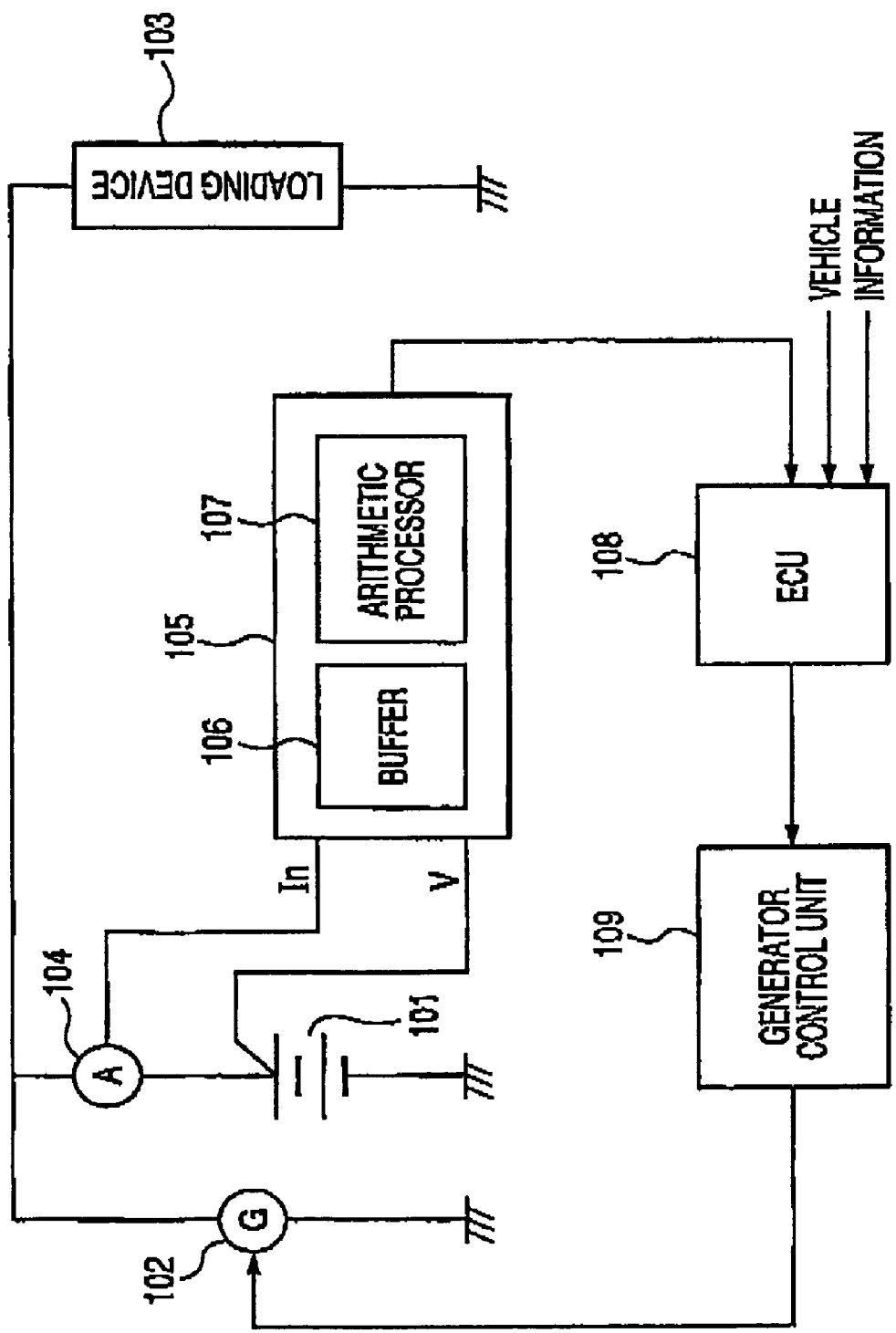
FIG. 1 is a block diagram showing a whole configuration of a charged state detecting apparatus (SOC arithmetic unit) for a secondary battery, according to a first embodiment of the present invention.

With reference to FIG. 1, a description is provided first on a battery state detecting apparatus (SOC arithmetic unit) serving as a charged state detecting apparatus for a secondary battery (hereinafter also referred as a "battery") related to a first embodiment of the present invention.

An in-vehicle secondary battery shown in FIG. 1 is provided with a battery 101, an on-vehicle generator 102 (hereinafter, simply referred to as "generator"), an on-vehicle electric loading device 103, a current sensor 104, battery state detector 105, an ECU 108 and a generator control unit 109. Among these components, the battery state detector 105 constitutes the charged-state detecting apparatus for a secondary battery of the present invention.

Batteries used for the battery 101 include, without limitation, a secondary battery, such as a lead-acid battery, a nickel-metal hydride battery and a lithium cell. In the present embodiment, a commonly used lead-acid battery for vehicles is used as the battery 101. The generator 102 is driven by an on-vehicle engine (not shown) to charge the battery 101. The electric loading device 103 constitutes electric load which consumes power supplied from the battery 101. The current sensor 104 detects charge/discharge current of the battery 101 to output the detected current in the form of digital signals.

The battery state detector 105 plays the roll of an electronic circuit for calculating an SOC of the battery 101 and is provided with a buffer 106 for inputting data and an arithmetic processor 107. The rolls of the buffer 106 and the arithmetic processor 107 are realized by a software operation of a microcomputer, but a dedicated hardware circuit may take the place. The buffer 106 samples and retains pairs (data pairs) of voltage V of the battery 101 and current In from the current sensor 104 at predetermined timing. The arithmetic processor 107 calculates an SOC based on parameters inputted from the buffer 106, using a method described later.

The ECU 108 calculates and determines an amount of generation of the generator 102 based on the SOC from the arithmetic processor 107 and on vehicle information 110 inputted from outside, such as an engine state, a vehicle speed, and a number of revolutions of the generator, and allows the generator 102, through the generator control unit 109, to perform generation equivalent to the determined amount of generation.

Figure 2:
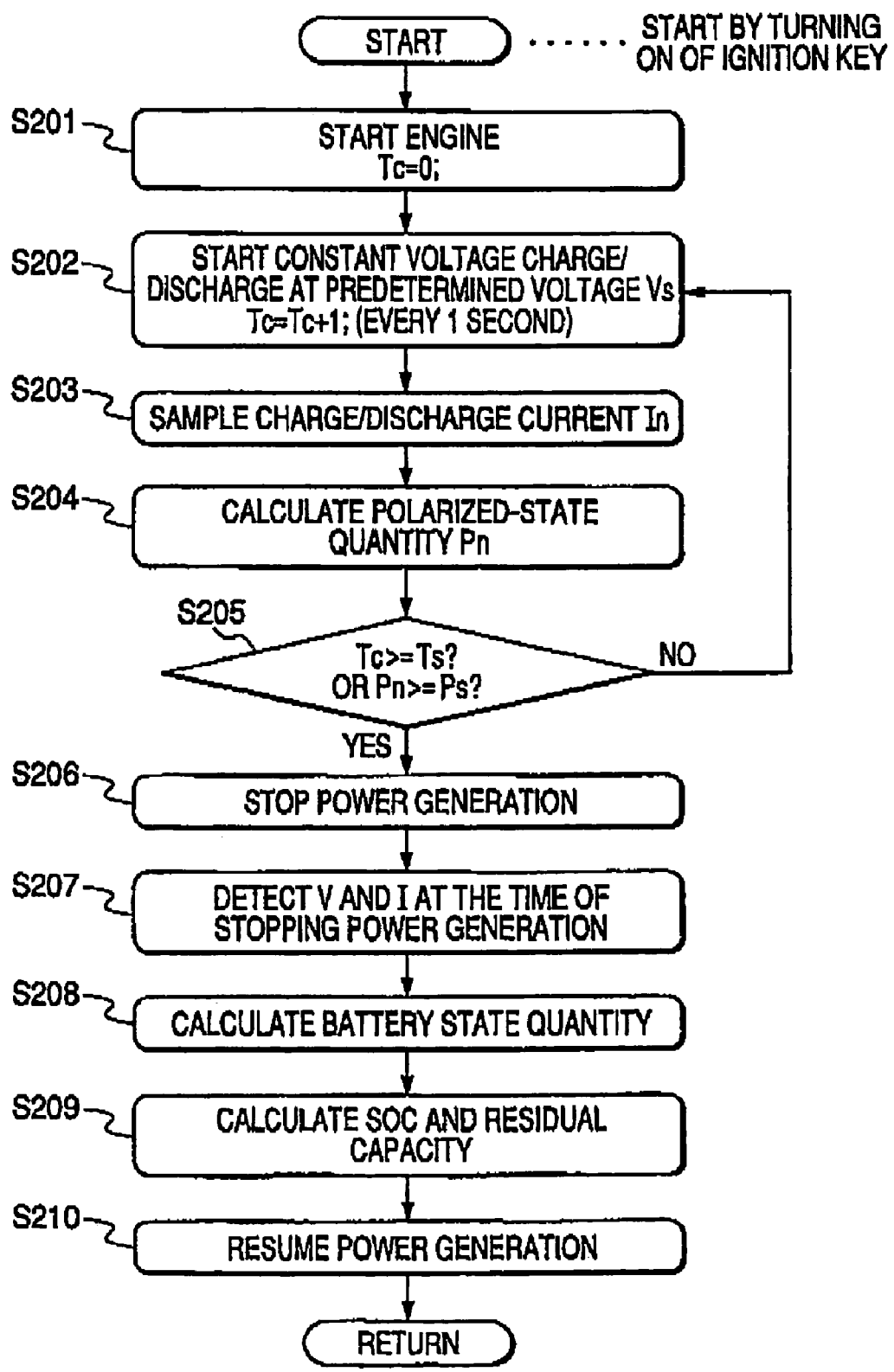
FIG. 2 is a flow diagram showing a specific example of an SOC calculation performed by the charged stated detecting apparatus for a secondary battery, according to the first embodiment of the present invention.

With reference to a flow diagram shown in FIG. 2, a specific example of an SOC calculation is described, which is performed by the arithmetic processor 107 in the battery state detector 105.

To begin with, an ignition key is turned on to reset the battery state detector 105, or a microcomputer. In this case, an integrated value Tc of a counter c constituting a built-in timer is reset at "0" (second). Then, the on-vehicle engine is started in a state of Tc="0" (step S201), so that constant voltage charge (or constant voltage discharge) is started at a predetermined voltage Vs to produce a predetermined charge (discharge) polarization state (step S202). After elapsing 1 second from starting step S202, "1" is added to the integrated value Tc of the counter c to proceed to the next step S203.

It should be appreciated that, in performing charge/discharge at the predetermined voltage Vs, it is preferable to set the predetermined voltage Vs at a value which can maintain either a charging state or a discharging state. In the present embodiment, the predetermined voltage Vs has been set at 14.1V (voltage regulated by a regulator at a temperature of 25° C.) in order to form a predetermined charge polarization state and in consideration of the current state's being immediately after the engine start. As a mater of course, however, the predetermined voltage Vs is not limited to this value.

The current In of the battery 101 is sampled in the constant-voltage state (step S203) to calculate a polarized-state quantity Pn based on the sampled current In (step S204). In the present embodiment, the polarized-state quantity Pn has been defined by the following formula:

$$Pn = Pn-1 + In \times \Delta t - Pn-1 \times \Delta t/\tau$$

where, $\Delta t$ is a sampling period for the current In, which has been set at 1 second ($\Delta t=1$) in the present embodiment, $\tau$ is a constant at the time of charge diffusion in a battery electrolyte, the constant being intended to be a predetermined value, Pn is precisely an instant value of the polarized-state quantity, and Pn−1 is a previous value of the polarized-state quantity Pn.

Explanation on this formula is given below. The instant value of the polarized-state quantity Pn is calculated by adding an increment $In \times \Delta t$ of the polarized-state quantity that has been increased from the point of the previous sampling to the point of the instant sampling, and by subtracting a decrement $Pn-1 \times \Delta t/\tau$ of the polarized-state quantity that has been decreased from the point of the previous sampling to the point of the instant sampling, to and from the previous value Pn−1 for the polarized-state quantity at the point of the previous sampling.

Subsequently, a determination is made as to whether or not the integrated value Tc of the counter c has become equal to or larger than a predetermined expiration period Ts for polarization stabilization (Tc≧Ts), or whether or not the polarized-state quantity Pn has become equal to or larger than a predetermined value Ps (Pn≧Ps) (step S205). If the result of the determination is YES, the polarization amount stabilization process by charging (discharging) the constant voltage as mentioned above is terminated to proceed to step S206. Contrarily, if the result of the determination is NO, control returns to step S202 to repeat the same processes.

Then, the generator control unit 109 is commanded to have the generation operation of the generator 102 stopped (step S206), and then a required number of pairs of the voltage V and the current In of the battery 101 at the time of stopping generation are sampled (step S207). Based on the sampled pairs of the voltage V and the current In, a battery state quantity, including the pseudo open-circuit voltage Vo and the internal resistance R, is calculated to estimate an SOC and a residual capacity (step S208).

In this regard, a known method of determining the pseudo open-circuit voltage Vo and the internal resistance R from the pairs of the voltage V and the current In is briefly described below.

First of all, a number of pairs of the voltage V and the current In that have been sampled are plotted in a voltage-current distribution chart indicating a two-dimensional distribution of the voltage V and the current In. The vertical axis of the chart indicates the voltage V and the horizontal axis, the current In.

Then, a linear approximation expressing a relation between the voltage V and the current In is created using a least-squares method based on the coordinate points of the plotted pairs of the voltages V and the currents In. Then, based on the linear approximation, an intercept (pseudo open-circuit voltage Vo) and an inclination (internal resistance R) are calculated. In this way, the pseudo open-circuit voltage Vo and the internal resistance R are determined.

After that, an SOC and a residual capacity are calculated using the battery state quantity, such as the pseudo open-circuit voltage Vo and the internal resistance R that have been determined as described above (step S209).

The following is a description on some processes of calculating the SOC and the residual capacity using the pseudo open-circuit voltage Vo and the internal resistance R as determined.

One method involves storing a map or a relation in advance, which is associated with the pseudo open-circuit voltage Vo, the internal resistance R, the SOC and the residual capacity, and assigning the pseudo open-circuit voltage Vo and the internal resistance R to the map or the relation, so that the SOC and the residual capacity can be determined.

One other method may involve inputting the determined pseudo open-circuit voltage Vo, the internal resistance R, and the pairs of the voltage V and the current In sampled at step S207 into a neural network, so that the SOC and the residual capacity are determined. Since these types of operations for the SOC and the residual capacity are well known, further explanation is omitted.

Then, power generation is resumed (step S210) to terminate the SOC calculation routine.

Although power generation has been stopped at step S206 of FIG. 2 to prevent charge polarization from being newly caused, the stoppage of power generation is not essential. Instead of stopping power generation, an amount of power generation may be decreased so that an amount of battery discharge can be increased that much.

Although the routine of FIG. 2 has been performed only once after starting the engine, steps S202 to S210 may be performed periodically or at predetermined timing in order to detect variation of the subsequent SOC and remaining capacity. Additionally, after calculating the SOC and the residual capacity through the routine of FIG. 2, the SOC and the residual capacity may be altered by using the current integrating method.

(Experimental Results)

Figure 3:
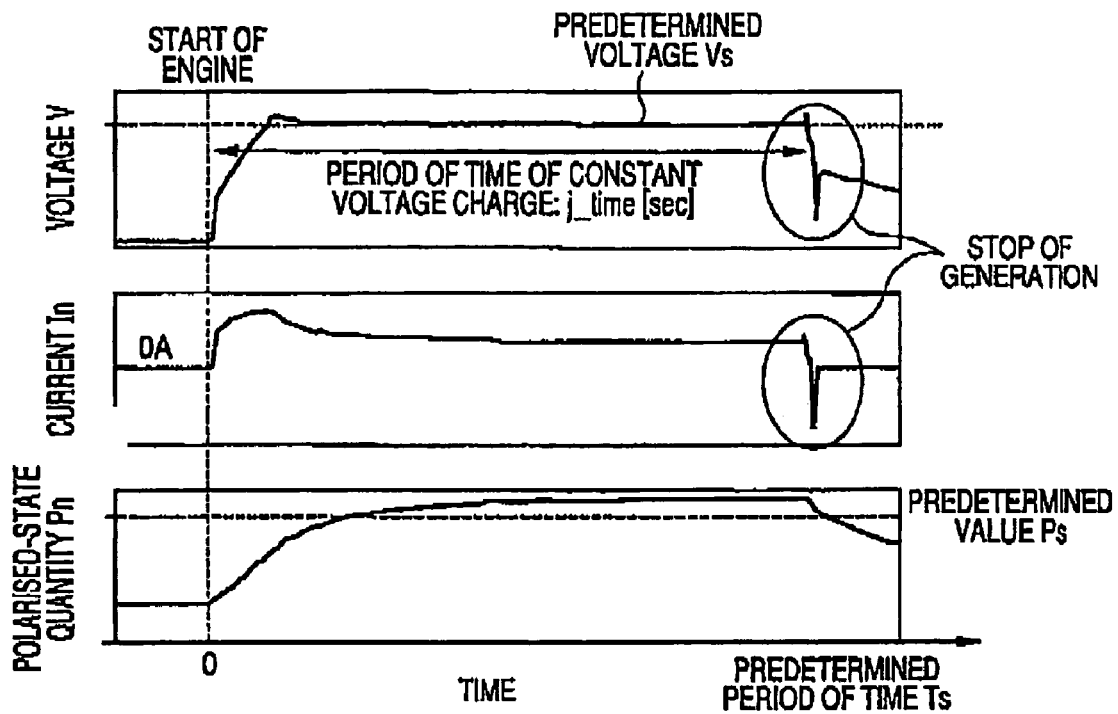
FIG. 3 is a timing diagram showing behaviors of voltage, current and polarized-state quantity of the charged state detecting apparatus for a secondary battery, according to the first embodiment of the present invention.

FIG. 3 shows behaviors of the voltage and the current of the battery 101 in the operation for detecting the SOC and the residual capacity shown in FIG. 2. Indicated by In is a charge current of the battery 101. However, the experimental results are of the case where the constant voltage charge is terminated in the predetermined period Ts at step S205.

In this case, after completing the engine start, a threshold voltage (regulated voltage) of the generator control unit 109, which is also referred to as a "regulator", is set at the predetermined voltage Vs, under which the battery 101 is charged. In this way, the polarized-state quantity Pn is increased, exceeds the predetermined value Ps, and comes close to a saturation value corresponding to the predetermined voltage Vs.

In this case, when the time Tc for performing constant voltage charging becomes equal to or larger than the predetermined expiration period Ts, generation is stopped, whereby the battery 101 drastically turns from a charged state to a discharged state. Thus, variety of different pairs of the voltage V and the current In can be sampled under substantially the same polarization conditions during this drastic current alteration period.

Based on the variety of pairs of the voltage V and the current In sampled at this time, the pseudo open-circuit voltage Vo and the internal resistance R are estimated using the method mentioned above. The estimation operation carried out in the present embodiment is further described in detail with reference to FIG. 4.

Figure 4:
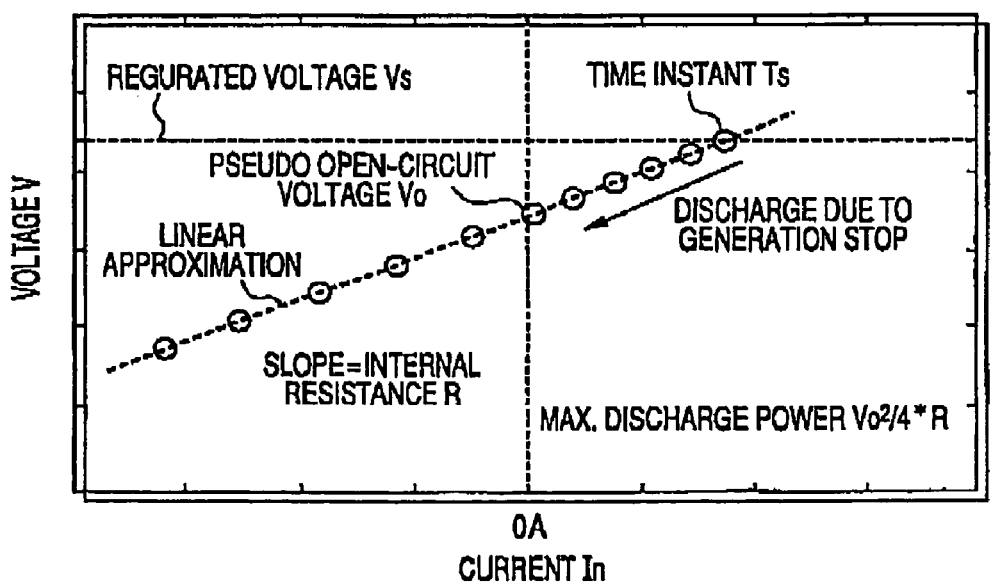
FIG. 4 is a voltage-current distribution chart showing an operation for estimating a pseudo open-circuit voltage and an internal resistance, which is performed by the charged state detecting apparatus for a secondary battery, according to the first embodiment of the present invention.
Figure 5:
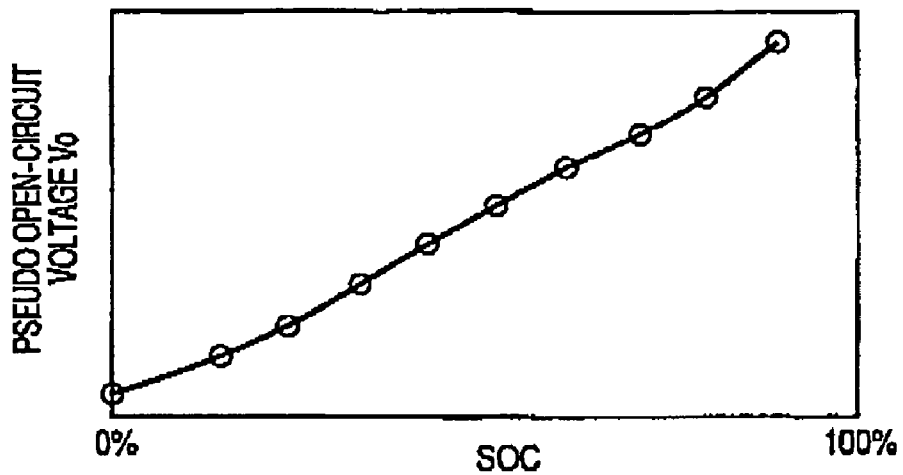
FIG. 5 is a chart showing a characteristic relation between a pseudo open-circuit voltage and an SOC.

FIG. 4 shows a voltage-current trajectory immediately after stoppage of power generation. After stopping power generation, the coordinate point defined by the pair of the voltage V and the current In linearly lowers on the two-dimensional plane defined by the voltage axis and the current axis which is orthogonal to the voltage axis shown in FIG. 4. Based on the individual coordinate points defined by the pairs of the voltage V and the current In at this time, a linear approximation is determined. An intercept voltage at zero (A) time in the linear approximation is to indicate the pseudo open-circuit voltage Vo, and the inclination of the linear approximation is to indicate the internal resistance R.

A relation between the pseudo open-circuit voltage Vo and the SOC (%) (see FIG. 5) has been stored in the battery state detector 105. Since the correlation between the two is strong, the SOC can be detected by assigning the pseudo open-circuit voltage Vo to this relation. Instead of storing the relation shown in FIG. 5 as a map, the SOC calculation may be performed by using a neural network that has learned input/output characteristics between input parameters, such as the pseudo open-circuit voltage Vo, and output parameters, such as the SOC. Since the SOC calculation using such a neural network is known, detailed explanation is omitted.

Figure 6A:
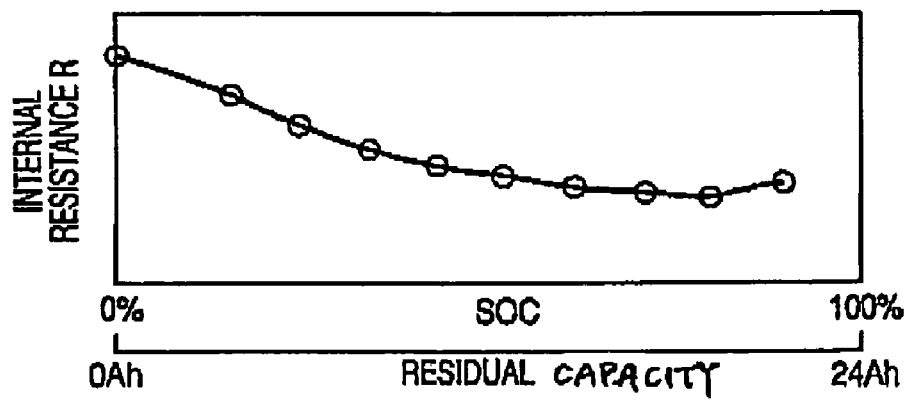
FIG. 6A is a chart showing a characteristic relation between an internal resistance, an SOC and a residual capacity.
Figure 6B:
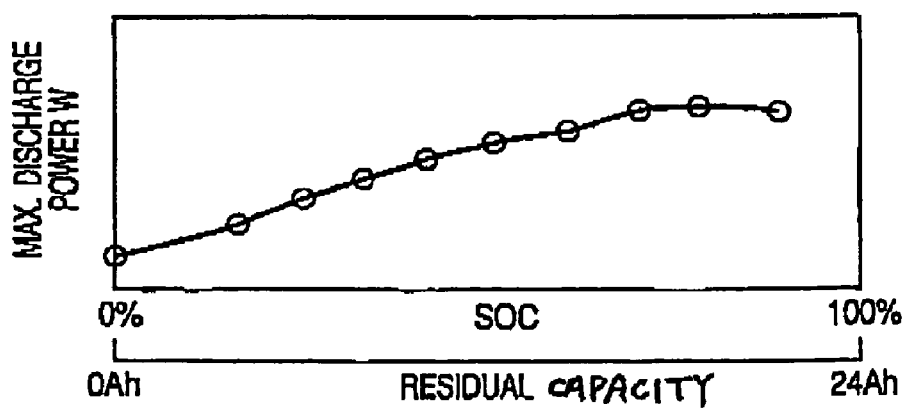
FIG. 6B is a chart showing a characteristic relation between a maximum discharge power, an SOC and a residual capacity.

A relation between the battery state quantity, such as the internal resistance R and a maximum discharge power W ($Vo^2/(4 \times R)$), and the SOC (%) and the SOH (residual capacity) (Ah) has been stored in the battery detector 105. The internal resistance R and the maximum discharge power W may be determined using this relation. As shown in FIGS. 6A and 6B, the internal resistance R and the maximum discharge power W of the battery are correlated with the SOC (%) and the residual capacity (Ah) which are indicative of a charged state of the battery. Although not shown in the figures, the internal resistance R and the maximum discharge power W of the battery are also correlated with the SOH (residual capacity) indicative of a deterioration state of the battery. Accordingly, the residual capacity (Ah) can be estimated based on the internal resistance R and the maximum discharge power W using the same operation method for the SOC (%) described above.

In the present embodiment, power generation by the generator 102 is stopped at step S206, however, instead of stopping power generation, the amount of generation may be reduced within a range of enabling sampling of the voltage V and the current In. Alternatively, in a short period of time immediately after expiration of the time Tc, loading of the electric loading device 103 may be changed to change the current of the battery 101. Further, in FIG. 4, power generation by the generator 102 is stopped by using the built-in timer, however, the power generation may be stopped when the polarized-state quantity Pn has reached the predetermined value Ps.

Second Embodiment

A second embodiment of the present invention is described below. In the second embodiment, the pseudo open-circuit voltage Vo is detected without stopping power generation of the generator 102. In the second embodiment, the identical or similar components or processes to those in the first embodiment are given the same references for the sake of simplification or omission of explanation.

Figure 7:
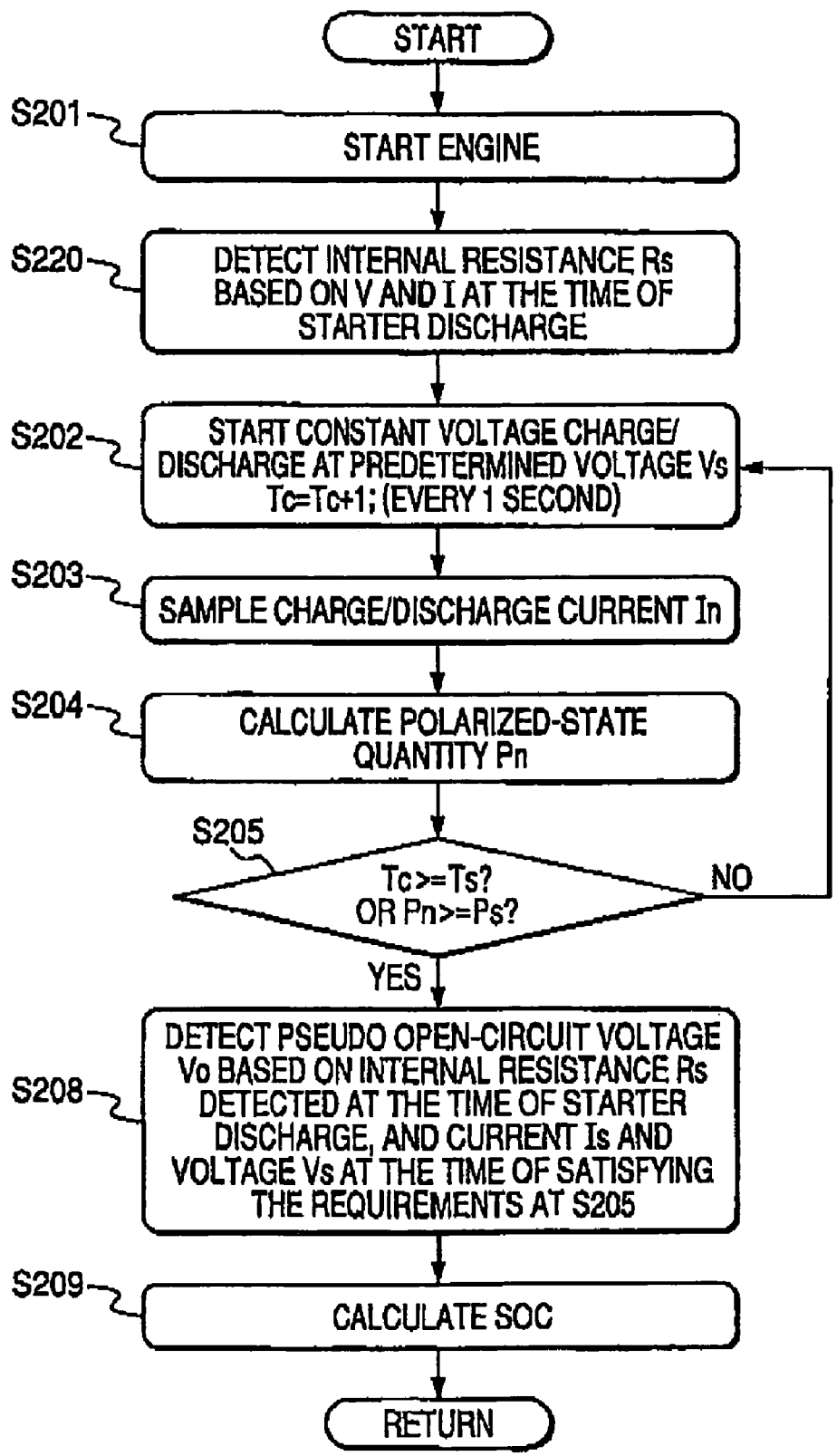
FIG. 7 is a flow diagram showing a specific example of an SOC calculation performed by a charged state detecting apparatus for a secondary battery, according to a second embodiment of the present invention.

With reference to FIG. 7, the present embodiment is explained. The processes shown in a flow diagram of FIG. 7 are performed by the arithmetic processor 107 in the battery state detector 105. This flow diagram is essentially the same as the one shown in FIG. 2 except that a step of calculating the internal resistance R has been added at the time of the engine start, the internal resistance R is used at step S208 to calculate the pseudo open-circuit voltage Vo, and the pseudo open-circuit voltage Vo is used at step S209 to calculate the SOC.

The present embodiment is characterized in that the internal resistance R for determining the inclination of the linear approximation is determined before executing stabilization control of the polarization state (steps S202 to S205 of FIG. 2), and that the linear approximation having the inclination is created based on the pairs of the voltage V and the current In (coordinate points) after completing the stabilization control of the polarization state so that the pseudo open-circuit voltage Vo is determined.

In FIG. 7, resetting for initialization is performed upon starting the engine to set the built-in timer at "0" (step S220). Then, an internal resistance Rs at the time of starter discharge is detected utilizing a large starting current at the time of the engine start (step S220).

In particular, since the battery voltage V is equal to the open circuit voltage Vo+I×Rs, a formula $\Delta V = \Delta I \times Rs$ is derived from two different pairs of voltage V and the current In, and from this formula, the internal resistance R is determined. In the formula, $\Delta V$ represents a voltage difference between the two pairs of the voltage V and the current In, and $\Delta I$ represents a current difference between the two pairs of the voltage V and the current In. Practically, a number of pairs of the voltage V and the current In are sampled, based on which a linear approximation is determined, so that the internal resistance R is estimated based on the inclination of the linear approximation.

At steps S202 to S205, a state of constant voltage charge (or constant voltage discharge) is maintained, so that the polarized-state quantity Pn is rendered to be a saturation value which is substantially equivalent to the constant voltage.

Subsequently, the pseudo open-circuit voltage Vo is determined based on a current value Is or the current In, the constant voltage Vs and the internal resistance R at the point of terminating the constant voltage discharge after satisfaction of the requirements (Tc≧Ts or Pn≧Ps, the former applies to the present embodiment) at step S205, i.e. at the expiration of the predetermined period Ts. In other words, a voltage value at the current value zero (A) on the approximate line drawn from a coordinate point (Vs, Is) on the two-dimensional plane mentioned above at an inclination equal to that of the internal resistance R, turns to be the pseudo open-circuit voltage Vo (step S208).

Then, the SOC is calculated based on the determined pseudo open-circuit voltage Vo (step S209).

(Examples of Experiments)

Figure 8:
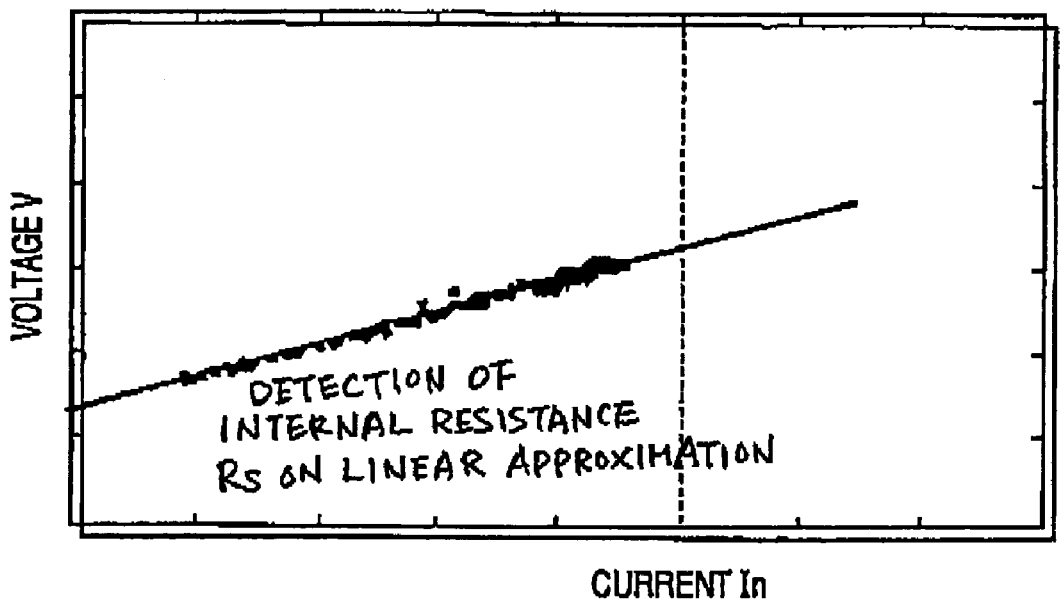
FIG. 8 is a voltage-current distribution chart showing an operation for detecting an internal resistance, which is performed by the charged state detecting apparatus for a secondary battery, according to the second embodiment of the present invention.
Figure 9:
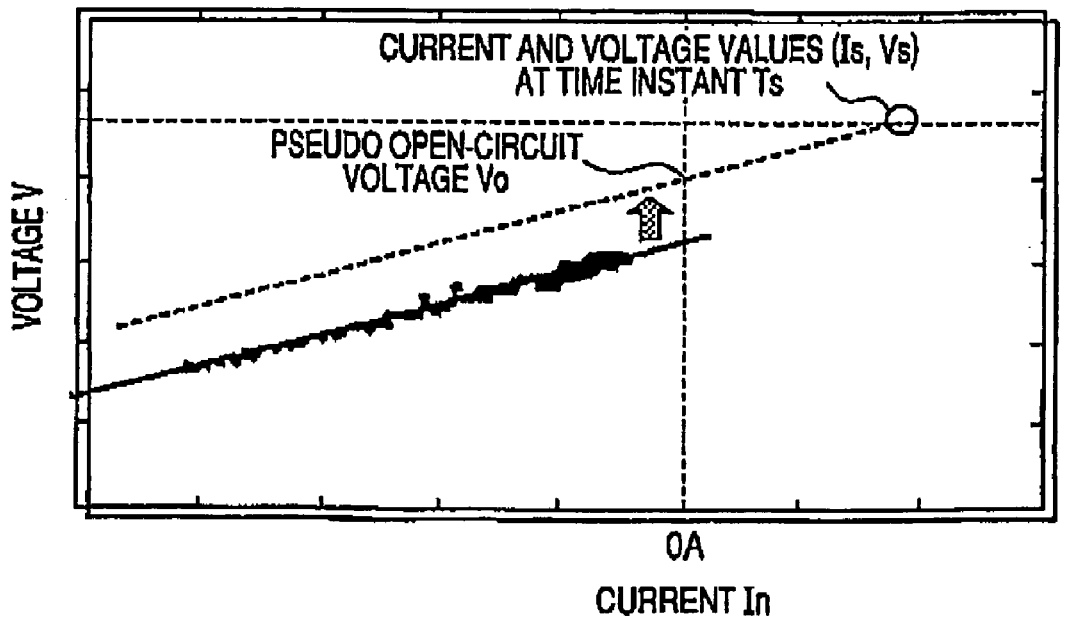
FIG. 9 is a voltage-current distribution chart showing an operation for calculating a pseudo open-circuit voltage, which is performed by the charged state detecting apparatus for a secondary battery, according to the second embodiment of the present invention.

FIG. 8 is a chart in which the pairs of the voltage V and the current In at an engine start are plotted. The inclination of the linear approximation obtained by this plotting serves as the internal resistance R. FIG. 9 is a chart showing a state where the pseudo open-circuit voltage Vo has been determined at a point where a line parallel to the linear approximation of FIG. 8 and passing through the coordinate point (Vs, Is) intersects with the zero (A) axis. When a current is Is, a voltage is Vs, and an internal resistance is Rs at the time Ts, the pseudo open-circuit voltage Vo can be obtained by the following formula:

$$Vo = Vs - Rs \times Is$$

It should be appreciated that, in the present embodiment, if only a predetermined stabilized polarization state is produced by controlling power generation or controlling electric loading devices without stopping power generation, and at this stage, if only the current of the battery is sufficiently altered for the linear approximation, the pseudo open-circuit voltage Vo can be estimated. Further, although the internal resistance R has been detected at the time of starter discharge, if only the current alteration is sufficiently large, the internal resistance R can be accurately detected from the formula $\Delta V = \Delta I \times Rs$. Therefore, an internal resistance value that has been obtained at the time of the charge/discharge current alteration immediately before the stabilization control of the polarization state may be used.

According to the structures in the present embodiment, the pseudo open-circuit voltage Vo can be estimated without stopping the generation. In general, in order to detect a voltage at a battery current of 0 (A), that is, the pseudo open-circuit voltage Vo, in the on-vehicle power system, it is necessary to bring the battery, which are now in charge or discharge state, into a current state of 0 (A) of the battery. This gives rise to variations in the voltage, resulting in for example light and dark in the lighting of on-vehicle illuminating devices. This was an inevitable problem for the conventional techniques. However, the present embodiment provides the above advantage which overcomes such a conventional problem.

Third Embodiment

A third embodiment of the present invention is described below. In the third embodiment, the identical or similar components or processes to those in the above embodiments are given the same references for the sake of simplification or omission of explanation.

According to the first and second embodiments, variation in the accuracy of SOC detection due to the variation of the polarized-state quantity Pn can be reduced by performing the stabilization control of the polarization state before estimating a charged state of the battery. However, the stabilization control of the polarization state according to the first and second embodiments is a control for allowing the polarization state of the battery 101 to serve as a predetermined reference polarization state. Hence, in order to realize the reference polarization state, it has been required to force the battery 101 to perform the constant voltage charge/discharge. In FIG. 1, however, the generator control unit 109 originally effects control to maintain the battery voltage at a predetermined level. If a driving state of the electric loading device 103 is stabilized, the generator 102 then takes charge of supplying power to the electric loading device 103, and thus the charge/discharge current of the battery 101 should have been small and the polarization state should have substantially disappeared.

Figure 10:
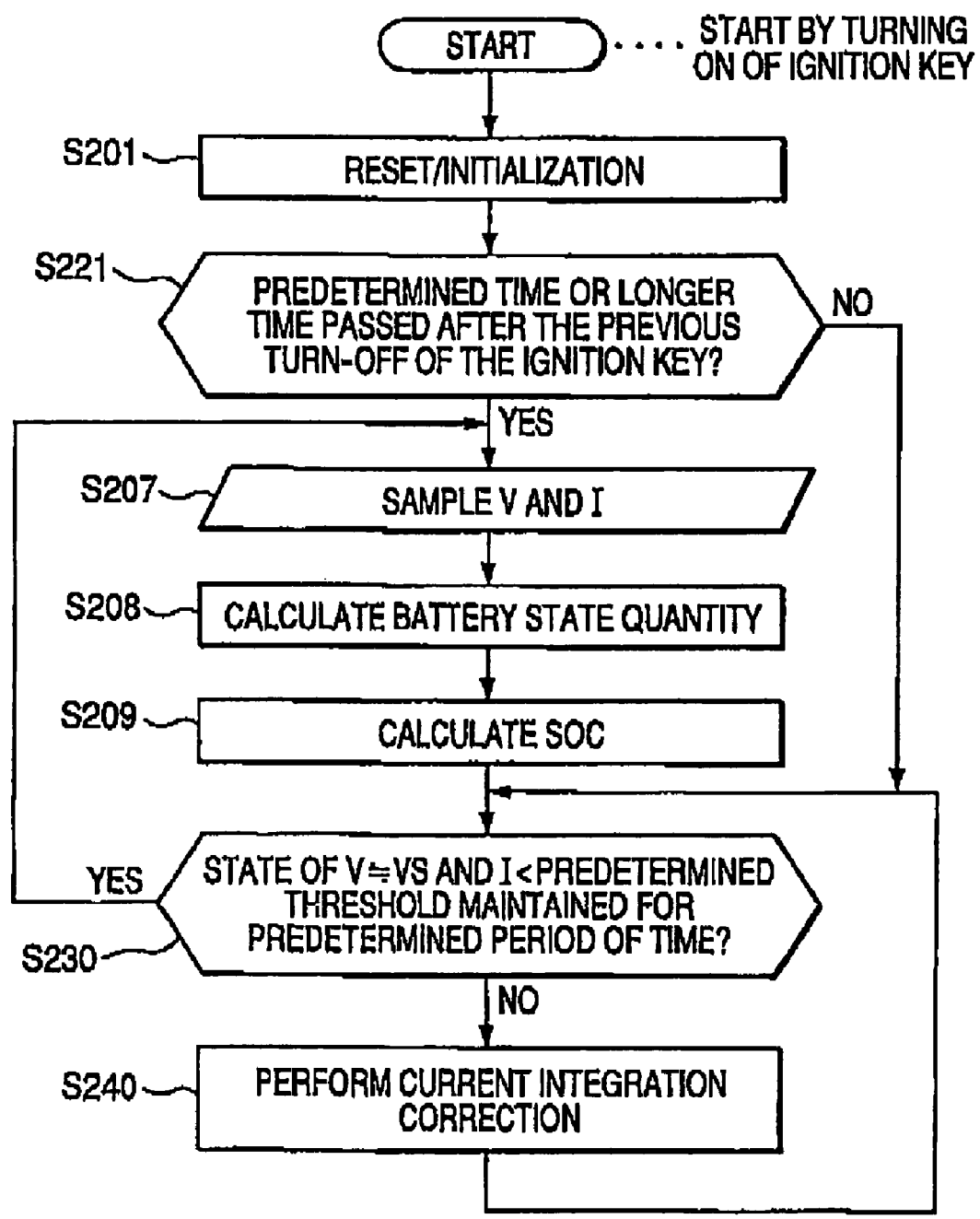
FIG. 10 is a flow diagram showing a specific example of an SOC calculation performed by a charged state detecting apparatus for a secondary battery, according to a third embodiment of the present invention.

In the present embodiment, a procedure shown in FIG. 10 is carried out. The procedure indicated in a flow diagram of FIG. 10 is performed by the arithmetic processor 107 in the battery state detector 105. In the example shown in FIG. 10, where the battery voltage V is stabilized at a level of the predetermined reference voltage value Vs, and where a battery current I is stabilized at a level lower than a predetermined value for a predetermined period of time or longer (step S230: YES), then, the polarization state is considered to have been stabilized (the polarization is considered to have substantially disappeared).

When such requirements are satisfied, the processes at steps S207 to S209 described above are performed. In other words, increase or decrease (including stoppage) of power generation, or increase or decrease of power consumption of the electric loading device 103 is performed in a predetermined short period of time, so that a required number of pairs of the voltage V and the current In is sampled (step S207). Then, a linear approximation is determined based on the pairs of the voltage V and the current In, and the linear approximation is then used to determine the pseudo open-circuit voltage Vo and the internal resistance R in the polarization disappearance state (step S208). Then, based on these data, charged state, such as an SOC, is estimated (step S209).

In FIG. 10, step S221 is a step for determining as to whether or not a predetermined time has passed since an ignition key has been previously turned off. In this regard, only when sufficient time required for eliminating polarization of the battery 101 has passed (step S221: YES), control proceeds to step S207, and further proceeds to step S230 through steps S207 to S209 described above. Contrarily, when the sufficient time has not passed (step S221: NO), control proceeds to step S230. Further, when the battery voltage is stabilized at the level of the predetermined reference voltage value Vs, and the battery current I is stabilized at the level lower than the predetermined value for the predetermined time or longer (step S230: YES), control returns to step S207 to repeat the same processes.

In this way, according to the present embodiment, the battery 101 is imposed with no load that would have been caused by the polarization stabilization processes of the first and second embodiments, which is convenient for the battery 101.

In the present embodiment, it sometimes happens that the state where the battery voltage is stabilized at the level of the reference voltage value and the battery current is stabilized at the level lower than the predetermined value for the predetermined time or longer, cannot be maintained for a predetermined time or longer (step S230: NO). In such a case, it is preferable to correct the SOC from the previously obtained SOC before the subsequent polarization disappearance, by using the current integrating process. The correction operation is shown at step S240 of FIG. 10.

In the present embodiment, when an engine start after the engine stoppage for the predetermined time or longer is considered, polarization of the battery 101 should have disappeared by the time of the engine start. Accordingly, if a linear approximation is created by sampling a required number of pairs of the voltage V and the current In at the time of the engine start in case the engine has stopped for the predetermined period of time or longer, a charged state, such as an SOC, of the battery in the state that polarization has substantially disappeared, can be estimated. This operation is shown at step S221 of FIG. 10

Fourth Embodiment

A fourth embodiment of the present invention is described below. The fourth embodiment is a modification of the embodiments described above, in which the identical or similar components or processes to those in the above embodiments are given the same references for the sake of simplification or omission of explanation.

Figure 11:
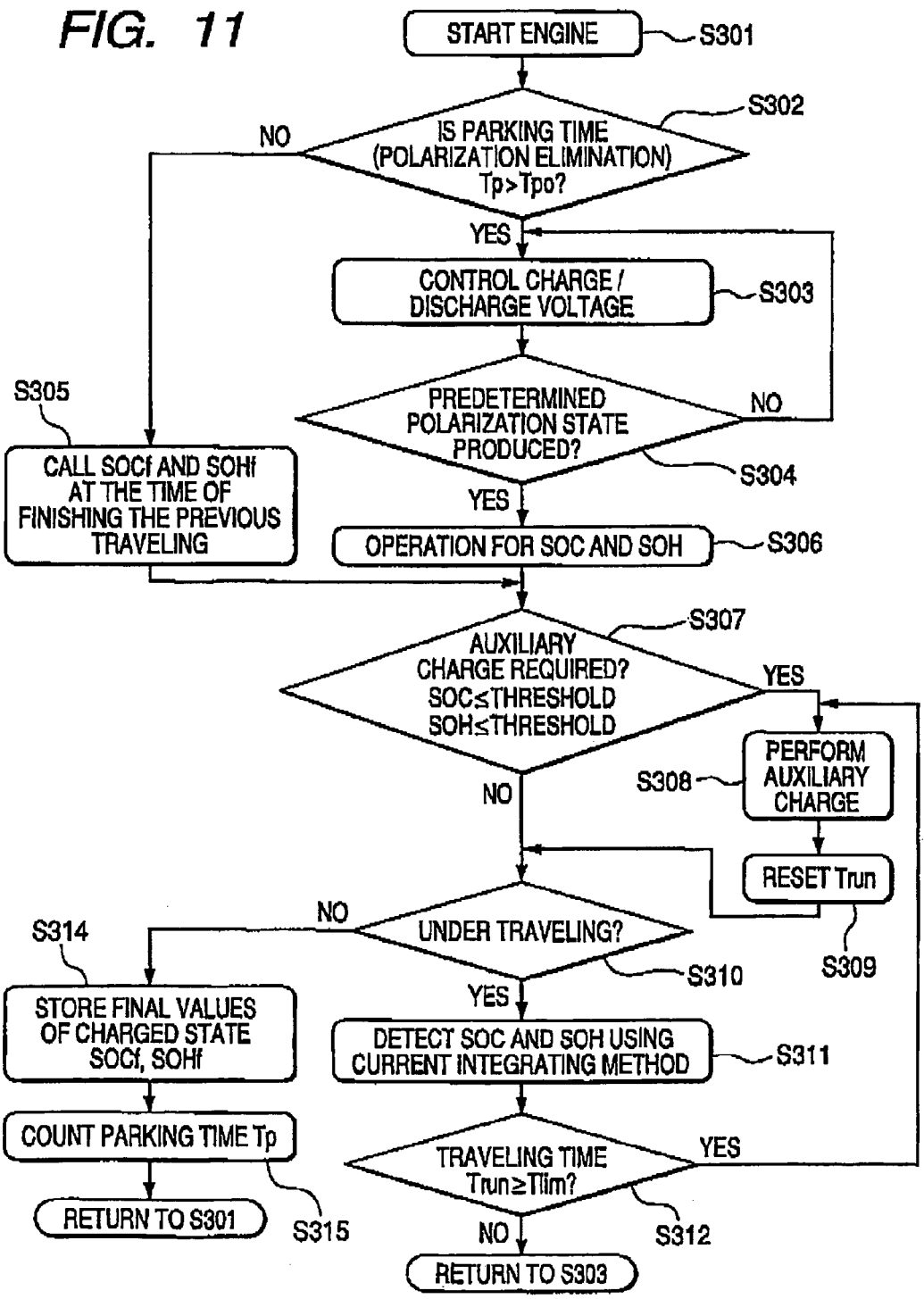
FIG. 11 is a flow diagram showing an operation performed by a charged state detecting apparatus for a secondary battery, according to a fourth embodiment of the present invention.
Figure 12:
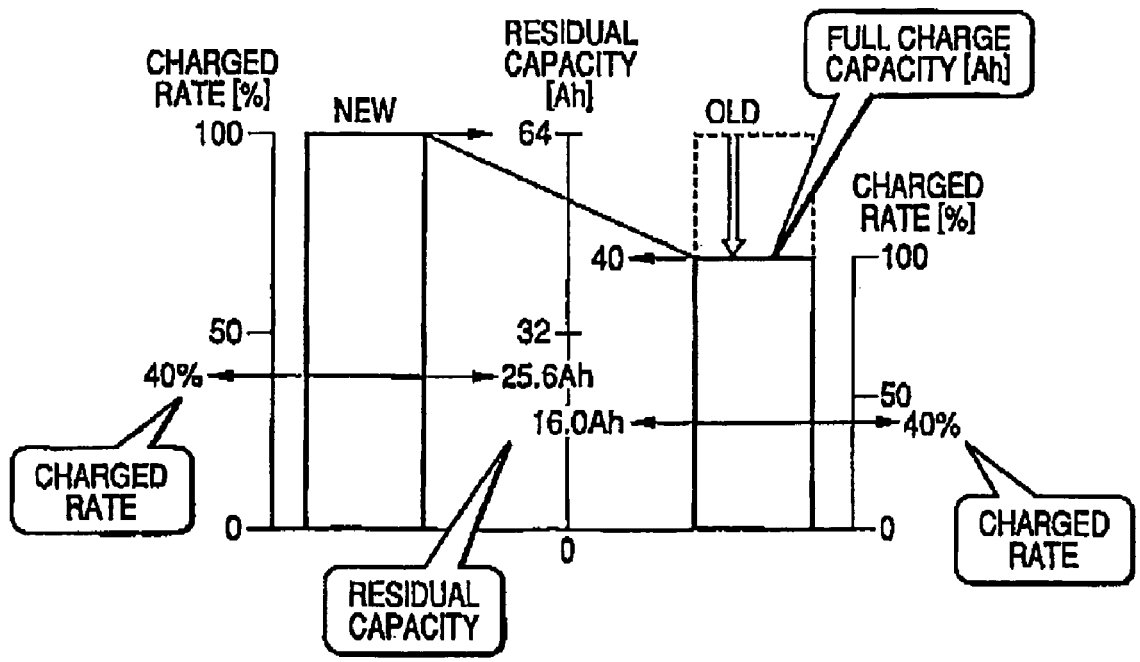
FIG. 12 illustrates the definitions of amounts indicating battery internal states involved in explaining the embodiments of the present invention.

Referring now to a flow diagram shown in FIG. 11, an operation of the present embodiment is described. It should be appreciated that the procedure shown in FIG. 11 is performed by the arithmetic processor 107 in the battery state detector 105.

The operation is started with an engine start (step S301). Depending on whether or not a calculated parking time Tp is larger than a threshold Tpo (Tp>Tpo), a determination is made as to whether or not an influence of polarization has disappeared (step S302). If it is determined that the influence of the polarization has not disappeared (step S302: NO), values of the SOC and the SOH at the time of finishing the previous traveling, i.e. an SOCf and an SOHf, are called to make them to be the instant values of the SOC and the SOH (step S305) for determination on the necessity of an auxiliary charge (step S307). Contrarily, if the influence is determined to have disappeared at step S302, the forced stabilization control of the polarization state (refer to the description provided above) by a charge/discharge voltage control, which is characteristic of the present embodiment, is performed (steps S303 and S304), and then an operation for detecting an SOC and an SOH is performed (step S306).

After that, a determination is made as to whether or not the auxiliary charge is necessary (step S307). The determination on the necessity of the auxiliary charge is made based on whether or not the SOC and the SOH are equal to or smaller than predetermined thresholds (minimum permissible values) (SOC≦threshold, SOH≦threshold).

If the SOC and SOH turn out to be equal to or smaller than the predetermined thresholds (step S307: YES), it is determined that the so auxiliary charge is necessary. In case the auxiliary charge is necessary, the generator control unit 109 is commanded to increase charge to thereby perform the auxiliary charge (step S308). Then, a traveling time Trun from the previous auxiliary charge is reset to resume the operation (step S309), and control proceeds to step S310.

On the other hand, if the auxiliary charge is determined not to be necessary (step S307: NO), it is determined as to whether or not the instant vehicle is traveling (step S310). If the instant vehicle is determined to be traveling (step S310: YES), an SOC and an SOH are calculated using the current integrating method (step S311). Then, a determination is made as to whether or not the traveling time Trun, which has been separately counted, has reached a predetermined threshold Tlim (Trun≧Tlim) (step S312). If the traveling time Trun has not reached the threshold Tlim (step S312: NO), control returns to step S303 to repeat the same processes. Contrarily if the traveling time Trun has reached the threshold Tlim (step S312: YES), control proceeds to step S308 to perform the forced auxiliary charge.

If the instant vehicle is determined not to be traveling, or to be in a state of stopping traveling, present values of the charged state (in this case, the SOC and the SOH) are stored as the final values SOCf and SOHf (step S314) of the charged state to resume counting the parking time Tp (step S315), and then control returns to step S301 to repeat the same processes.

Specifically, the present embodiment utilizes a high-accuracy detection of a charged state of the battery 101 after the forced stabilization of the polarization state, whereby a high-accuracy determination is enabled as to whether or not an auxiliary charge is necessary, depending on the charged state. Thus, the auxiliary charge is performed only when required, or when the SOC and the SOH are small.

In the present embodiment as well, the forced auxiliary charge is carried out after expiration of the predetermined time from the previous auxiliary charge. This forced auxiliary charge is performed for the purpose of improving safety and is not essential. Therefore, comparing with the periodically performed conventional auxiliary charge, a remarkably longer interval can be set in the present embodiment. According to the present embodiment, useless auxiliary charges can be omitted, by which power saving can be realized and good influence can be given to a battery life.

What is claimed is:

1. An apparatus for detecting a charged state of a battery being mounted on a vehicle, the apparatus comprising:
    a data acquiring device configured to acquire a plurality of pairs of data consisting of current and voltage of the battery;
    a stabilizing device configured to stabilize a polarized state of the battery;
    a first calculating device configured to calculate a pseudo open-circuit voltage of the battery based on i) the pairs of data acquired in a state where the polarized state of the battery is stabilized and ii) an internal resistance of the battery calculated at a latest sampling time; and
    a second calculating device configured to calculate, as the charged state, a state of charge based on the pseudo open-circuit voltage.

2. The apparatus according to claim 1, wherein the stabilizing device is configured to charge and discharge the battery over a specified period of time.

3. The apparatus according to claim 1, wherein the stabilizing device is configured to make an amount of polarization of the battery converge at a predetermined amount, the amount of polarization of the battery being calculated based on charge and discharge currents acquired when the battery is subjected to charge and discharge at a fixed voltage.

4. The apparatus according to claim 1, further comprising control means for controlling the stabilizing device and the first and second calculating devices such that the polarized state of the battery is stabilized immediately after an engine being mounted on the vehicle is started up and, immediately after the stabilization of the polarized state, the charged state of the battery is detected.

5. The apparatus according to claim 1, further comprising control means for controlling the stabilizing device and the first and second calculating devices such that the polarized state of the battery is stabilized at intervals during an operation of an engine being mounted on the vehicle and, immediately after the stabilization of the polarized state, the charged state of the battery is detected.

6. The apparatus according to claim 1, wherein
    the battery is connected to a generator being mounted on a vehicle so as to receive power to be charged from the generator,
    the apparatus further comprising
    command means for commanding the generator to raise the power to be charged only when the charged state of the battery detected immediately after the stabilization of the polarized state of the battery is less than a minimum reference value.

7. The apparatus according to claim 1, wherein the first calculating device includes means for detecting the internal resistance of the battery immediately after an engine being mounted on the vehicle is started up.

* * * * *